US011013118B2

(12) United States Patent
Watanabe

(10) Patent No.: US 11,013,118 B2
(45) Date of Patent: May 18, 2021

(54) ELECTRONIC COMPONENT MOUNTING STRUCTURE AND METHOD

(71) Applicant: jujube LLC, Hokuto (JP)

(72) Inventor: Taiji Watanabe, Hokuto (JP)

(73) Assignee: JUJUBE LLC, Hokuto (JP)

( * ) Notice: Subject to any disclaimer, the term of this patent is extended or adjusted under 35 U.S.C. 154(b) by 0 days.

(21) Appl. No.: 16/691,079

(22) Filed: Nov. 21, 2019

(65) Prior Publication Data
US 2020/0375034 A1 Nov. 26, 2020

(30) Foreign Application Priority Data

May 23, 2019 (JP) .............................. JP2019-097025

(51) Int. Cl.
H05K 1/11 (2006.01)
H05K 1/18 (2006.01)
H05K 1/02 (2006.01)
H05K 3/34 (2006.01)
H05K 3/30 (2006.01)

(52) U.S. Cl.
CPC ........... H05K 1/181 (2013.01); H05K 1/0298 (2013.01); H05K 1/113 (2013.01); H05K 1/117 (2013.01); H05K 3/303 (2013.01); H05K 3/341 (2013.01); H05K 2201/02 (2013.01);
(Continued)

(58) Field of Classification Search
CPC ........ H05K 1/117; H05K 1/184; H05K 1/182; H05K 3/3405; H05K 3/403; H05K 2201/0919; H05K 2201/1034; H05K 2201/10446
See application file for complete search history.

(56) References Cited

U.S. PATENT DOCUMENTS 4,400,762 A * 8/1983 Bartley ................. H01L 25/165
257/E25.031
5,621,193 A * 4/1997 Isaak ................. H01L 23/49805
174/262

(Continued)

FOREIGN PATENT DOCUMENTS

JP 50-28246 U 7/1973
JP 2-232986 A 9/1990
(Continued)

OTHER PUBLICATIONS

English Translation JP2008034672 (Year: 2008).*

Primary Examiner — Steven T Sawyer
(74) Attorney, Agent, or Firm — Westerman, Hattori, Daniels & Adrian, LLP

(57) ABSTRACT

Provided is an electronic component mounting structure and method for mounting electronic components on the side of a printed circuit board by means of simple fabrication and enlarging the surface area for mounting electronic components. A cut face of a conductive plating layer, which is obtained by cutting along a via in which a conductive plating layer covering an inner wall face of a via hole is electrically connected to a conductive pattern layer of the printed circuit board, is exposed at a cut end face and used as a land pattern which is solder-connected to a mount connecting portion of the electronic component. The end face at which the land pattern is exposed is a surface parallel to the side of the printed circuit board, and therefore electronic components can be mounted on the end face parallel to the side.

2 Claims, 13 Drawing Sheets

(52) U.S. Cl.
CPC .............. *H05K 2201/095* (2013.01); *H05K 2201/09481* (2013.01); *H05K 2201/09754* (2013.01)

(56) References Cited

U.S. PATENT DOCUMENTS

| | | | | |
|---|---|---|---|---|
| 6,144,090 | A | * | 11/2000 | Higashiguchi ......... H05K 3/225 257/693 |
| 2004/0157410 | A1 | * | 8/2004 | Yamaguchi ....... H01L 23/49805 438/460 |
| 2009/0166078 | A1 | * | 7/2009 | Matsui ................... H05K 3/403 174/262 |
| 2015/0362133 | A1 | * | 12/2015 | Lin ........................... F21K 9/20 362/382 |

FOREIGN PATENT DOCUMENTS

| | | |
|---|---|---|
| JP | 4-271188 A | 9/1992 |
| JP | 7-10973 U | 2/1995 |
| JP | 2000-114701 A | 4/2000 |
| JP | 2000-260509 A | 9/2000 |
| JP | 2008-34672 A | 2/2008 |
| JP | 2010-10326 A | 1/2010 |
| JP | 2017-37877 A | 2/2017 |

* cited by examiner

ELECTRONIC COMPONENT MOUNTING STRUCTURE AND METHOD

BACKGROUND

Technical Field

The present invention relates to an electronic component mounting structure and method for mounting electronic components on a printed circuit board and more particularly, relates to an electronic component mounting structure and method for surface-mounting electronic components on an end face parallel to the side of a printed circuit board.

Related Art

Conventionally, various electronic components such as resistors, coils, electrical connectors, sockets, and IC chips, and the like, are mounted on a surface of a printed circuit board (a top face of the circuit board parallel to the circuit board) during a surface-mount. In other words, in this surface-mounting process, a conductive pad, which is exposed to a bottom face of the electronic component, is placed, via solder cream or the like, on a land pattern formed on the surface of the printed circuit board, and the electronic component and conductive pattern of the printed circuit board are electrically connected by soldering together, via a reflow furnace, the land pattern and the conductive pad using solder cream.

In this mounting structure, because the surface area of the surface of the printed circuit board (planar face parallel to the circuit board) is limited, there is a limit to the quantity and size of the electronic components mounted on this surface. In particular, because electronic components are being miniaturized and made more lightweight, there is a need for mounting using the highest possible density on a printed circuit board of a limited size, and therefore when the number of electronic components being mounted increases even by one, it has been necessary to implement an extensive design change for changing to a larger printed circuit board and, for this purpose, also changing the shape of the electronic component case.

Therefore, an electronic component mounting structure having an enlarged mounting surface area to enable mounting of electronic components also on the side of a printed circuit board is disclosed in JP H4-271188 A. The electronic component mounting structure disclosed in JP H4-271188 A involves creating a land obtained by exposing an internal copper foil (conductive pattern layer) of a printed circuit board to the side of the circuit board and solder-connecting this exposed portion, or a copper-plating portion applied to the exposed portion, to a connecting portion of an electronic component, thereby enabling the electronic component to be mounted on the side of the circuit board.

In addition, as illustrated in FIG. 17, an electronic component mounting structure 100, in which a male connector 101 which is mounted on a surface 110a of a printed circuit board 110 and a female connector 103 which is mounted on a surface 120a of a printed circuit board 120 are fitted and connected together, and which has an enlarged surface area for mounting an electronic component on the surfaces 110a and 120a, is also known (JP 2000-260509 A).

This electronic component mounting structure 100 has a male contact 102 of the male connector 101 and a female contact 104 of the female connector 103, each of which is formed by punching a conductive metal plate in the plate thickness direction thereof so as to protrude toward the surfaces 110a and 120a of the printed circuit boards 110 and 120 from each of the insulating housings 105 and 106, and such that the planar faces of the cut faces opposing the surfaces 110a and 120a become mount connecting portions 102a and 104a.

On the other hand, land patterns (not shown) are formed on the surfaces 110a and 120a of the printed circuit boards 110 and 120 opposing the mount connecting portions 102a and 104a, and by solder-connecting the mount connecting portions 102a and 104a to the land patterns, the male connector 101 and female connector 103 are mounted on the surfaces 110a and 120a of the printed circuit boards 110 and 120, respectively.

When the male connector 101 and female connector 103 are fitted and connected together as illustrated in FIG. 17, the conductive patterns wired to the surfaces 110a and 120a of the printed circuit boards 110 and 120 are electrically connected via the female contact 104 and male contact 102 which are in contact with each other. By electrically connecting the printed circuit boards 110 and 120 in a laminated arrangement in this manner, even when the mounting surface area for mounting electronic components is enlarged, a plurality of circuit boards can be efficiently arranged in an electronic device housing and the occupied space within the device housing can be minimized.

SUMMARY

The electronic component mounting structure disclosed in JP H4-271188 A involves solder-connecting connecting portions of an electronic component to an exposed portion of an internal copper foil (conductive pattern layer) which is exposed at the side of the printed circuit board, and therefore the mount position of the electronic component is constrained to the exposure position of the internal copper foil (conductive pattern layer), and because the exposed portion is miniature, it is difficult to solder-connect the connecting portions of the electronic component.

Furthermore, when solder-connecting the connecting portions of the electronic component to a copper-plating portion applied to the exposed portion of the internal copper foil (conductive pattern layer) which is exposed at the side of the printed circuit board, there has been a problem in that the plating process of applying the copper plating portion to a specified internal copper foil without electrically connecting, at the side of the printed circuit board, to another internal copper foil (conductive pattern layer) exposed at the side is extremely difficult, and in that the mount position of the electronic component is similarly constrained to the position of the copper plating portion.

In the conventional electronic component mounting structure 100 illustrated in FIG. 17, because mounting surfaces 110a and 120a for mounting electronic components of the two printed circuit boards 110 and 120 are arranged in parallel and facing each other, an electronic component which stands high above the mounting surface cannot be mounted, thereby limiting the selection of electronic components and constraining the mount position thereof.

In addition, because stacking between the two printed circuit boards 110 and 120 is implemented in the lamination direction (vertical direction in FIG. 17), the height of the two printed circuit boards 110 and 120 in the lamination direction is high and same cannot be arranged in a low-profile, height-restricted electronic device. The conductive patterns wired to each of the surfaces 110a and 120a of the printed circuit boards 110 and 120 are parallel and close to each other, and generation of electromagnetic interference therebetween when a high-frequency signal flows has been a concern.

The present invention was conceived in view of such conventional problems, and an object thereof is to provide an electronic component mounting structure and mounting method with which, by means of straightforward fabrication, an electronic component is mounted on a side of a printed circuit board and the surface area for mounting the electronic component is enlarged.

A further object is to provide an electronic component mounting structure and method with which there are no constraints on the size or mount positions of electronic components which are mounted.

A further object is to provide an electronic component mounting structure and method with which electromagnetic interference between conductive patterns wired to the printed circuit board is reduced even when two printed circuit boards are connected by fitting and connecting together a set of connectors.

In order to achieve the foregoing objects, the electronic component mounting structure according to claim 1 is an electronic component mounting structure, including: at least on a surface of, back face of, or inside an insulated substrate, a printed circuit board having one or two or more conductive pattern layers wired in parallel to the insulated substrate, and a via in which a via hole contacts at least any of the conductive pattern layers and a conductive plating layer covering an inner wall face of the via hole is electrically connected to the conductive pattern layer contacting the via hole, a cut face of the conductive plating layer being exposed at an end face obtained by cutting along the via; and an electronic component whose mount connecting portion faces a part corresponding to the cut face of the conductive plating layer obtained by cutting along the via, the electronic component being surface-mounted on the end face of the printed circuit board by using the cut face of the conductive plating layer as a land pattern which is solder-connected to the mount connecting portion, wherein the via, through which the conductive plating layer is electrically connected to the plurality of conductive pattern layers, is partitioned by means of a hole or a groove provided between connecting parts which are cut along the via and electrically connected to the plurality of conductive pattern layers, and wherein the cut faces of the plurality of conductive plating layers, which are insulated from one another as a result of being partitioned by means of the hole or the groove, are used as the land patterns, respectively, which are electrically connected to the plurality of conductive pattern layers.

A via which is formed with the objective of interconnecting a plurality of conductive pattern layers is divided into a plurality of vias by means of a hole or a groove, and the conductive plating layers of each of the divided vias are insulated from one another and electrically connected to the respective conductive pattern layers.

The electronic component mounting structure according to claim 2 is an electronic component mounting structure, wherein the printed circuit board includes a conductive filler formed of a conductive paste with which the via hole is filled, wherein a cut face of the conductive filler is exposed contiguously in the same plane between a pair of cut faces of the conductive plating layer of the end face which is obtained by cutting along the via, and wherein the cut faces of the plurality of conductive plating layers and/or conductive filler, which are insulated from one another as a result of being partitioned by means of the hole or the groove, are used as the land patterns, respectively, which are electrically connected to the plurality of conductive pattern layers.

In a pad on via manufacturing process, the via hole is filled with a conductive filler formed of a conductive paste.

The width of the cut face of the conductive plating layer obtained by cutting along the via is a narrow width corresponding to the plating thickness of the conductive plating layer, and the cut face of the conductive filler, which is formed of a conductive paste, is contiguous in the same plane between a plurality of pairs of narrow cut faces of the conductive plating layers which are insulated from one another as a result of being partitioned by a hole or groove.

The electronic component mounting structure according to claim 3 is an electronic component mounting structure, including: at least on a surface of, back face of, or inside an insulated substrate, a printed circuit board having one or two or more conductive pattern layers wired in parallel to the insulated substrate, and a via in which a via hole contacts at least any of the conductive pattern layers and a conductive plating layer covering an inner wall face of the via hole is electrically connected to the conductive pattern layer contacting the via hole, a cut face of the conductive plating layer being exposed at an end face obtained by cutting along the via; and an electronic component whose mount connecting portion faces a part corresponding to the cut face of the conductive plating layer, wherein the end face obtained by cutting along the via protrudes from an adjacent side of the printed circuit board, and wherein the electronic component is an electrical connector which is fitted and connected to a mating connector which is mounted on a planar face of another mating printed circuit board.

Because the electrical connector is mounted on a parallel end face in the thickness direction of the printed circuit board, when the electrical connector is fitted and connected to the mating connector, the printed circuit board is connected along a vertical direction which is orthogonal to the planar face of the other printed circuit board.

The electronic component mounting structure according to claim 4 is an electronic component mounting structure, wherein the printed circuit board includes a conductive filler formed of a conductive paste with which the via hole is filled, and the cut face of the conductive filler is exposed contiguously in the same plane between the pair of cut faces of the conductive plating layer of the end face which is obtained by cutting along the via, and wherein the cut face of the conductive plating layer and/or the conductive filler is used as the land pattern which is solder-connected to the mount connecting portion of the electrical connector.

In a pad on via manufacturing process, the via hole is filled with a conductive filler formed of a conductive paste.

The width of the cut face of the conductive plating layer is a narrow width corresponding to the plating thickness of the conductive plating layer, and by cutting along the via, the cut face of the conductive filler formed of a conductive paste is contiguous in the same plane between the pair of cut faces of the conductive plating layer.

The electronic component mounting structure according to claim 5 is an electronic component mounting structure, including: a printed circuit board having a first via in which a first via hole contacts a back face conductive pattern layer which is wired along a back face of an insulated substrate, and a first conductive plating layer covering an inner wall face of the first via hole is electrically connected to the back face conductive pattern layer and a second via in which a second via hole contacts a surface conductive pattern layer which is wired along the surface of the insulated substrate in a projection range in which the back face conductive pattern layer is projected onto the surface of the insulated substrate, and a second conductive plating layer covering an inner wall face of the second via hole is electrically connected to the surface conductive pattern layer, cut faces of the first conductive plating layer and the second conductive plating layer being exposed at an end face obtained by cutting along the first via and the second via; and a coaxial connector having an external contact whose first mount connecting portion faces a part corresponding to the cut face of the first conductive plating layer and a core contact whose second mount connecting portion faces a part corresponding to the cut face of the second conductive plating layer, wherein the cut faces of the first conductive plating layer and the second conductive plating layer are used as land patterns to which the first mount connecting portion of the external contact and the second mount connecting portion of the core contact, respectively, are solder-connected, and wherein the coaxial connector is electrically connected to a microstrip line which is configured from the back face conductive pattern layer constituting a ground pattern and the surface conductive pattern layer constituting a signal pattern.

The coaxial connector is connected to the microstrip line, which is configured on a printed circuit board from the back face conductive pattern layer and the surface conductive pattern layer, in the same direction as the microstrip line.

The electronic component mounting structure according to claim 6 is an electronic component mounting structure, wherein the printed circuit board further includes a first conductive filler formed of a conductive paste with which the first via hole is filled and a second conductive filler formed of a conductive paste with which the second via hole is filled, and the cut faces of the first conductive filler and the second conductive filler are exposed contiguously in the same plane, respectively, between the pair of cut faces of the first conductive plating layer and the pair of cut faces of the second conductive plating layer of the end face, and wherein the cut faces of the first conductive plating layer and/or the first conductive filler and the second conductive plating layer and/or the second conductive filler are used as land patterns to which the first mount connecting portion of the external contact and the second mount connecting portion of the core contact, respectively, are solder-connected.

In a pad on via manufacturing process, the first via hole and the second via hole are filled with the first conductive filler and the second conductive filler, respectively, which are formed of a conductive paste.

Because the cut faces of the first conductive plating layer and/or the first conductive filler and the second conductive plating layer and/or the second conductive filler, which are exposed at the end face obtained by cutting along the vias, are used as land patterns to which the first mount connecting portion of the external contact and the second mount connecting portion of the core contact, respectively, are solder-connected, the coaxial connector can be surface-mounted on the side of the printed circuit board by means of simple fabrication in cutting along the vias.

The electronic component mounting structure according to claim 7 is an electronic component mounting structure, including: a printed circuit board having a first conductive pattern layer configured from a plurality of surface-side wiring patterns wired insulated from one another along a surface of an insulated substrate, a second conductive pattern layer configured from a plurality of back face-side wiring patterns wired insulated from one another along a back face of the insulated substrate, and a plurality of vias in which a plurality of via holes contact the plurality of surface-side wiring patterns and back face-side wiring patterns, respectively, which are stacked in a thickness direction of the insulated substrate, and conductive plating layers covering inner wall faces of the plurality of via holes are electrically connected to the surface-side wiring patterns and the back face-side wiring patterns, respectively, which contact the via holes, the cut face of the conductive plating layer in each of the plurality of vias being exposed at an end face obtained by cutting along the plurality of vias; and a connector for connecting printed circuit boards in which a foot portion of each of a plurality of contacts faces a part corresponding to the cut face of the conductive plating layer, for each of the plurality of vias, the connector for connecting printed circuit boards being surface-mounted on the end face of the printed circuit board by using the cut face of the conductive plating layer as a land pattern which is solder-connected to the foot portion of each of the contacts, wherein the vias, through which the conductive plating layers are electrically connected to the plurality of surface-side wiring patterns and back face-side wiring patterns, respectively, are partitioned by means of a groove provided between connecting parts which are cut along the vias and electrically connected to the surface-side wiring patterns and the back face-side wiring patterns, and wherein the cut faces of the plurality of conductive plating layers, which are insulated from one another as a result of being partitioned by means of the groove, are used as the land patterns which are electrically connected to the surface-side wiring patterns and the back face-side wiring patterns, respectively.

In a state where each contact of an electrical component is electrically connected to each of a plurality of wiring pattern layers of the printed circuit board, a connector for connecting printed circuit boards is mounted on an end face of the printed circuit board.

The electronic component mounting structure according to claim 8 is an electronic component mounting structure, wherein the printed circuit board further includes a conductive filler formed of a conductive paste with which the plurality of via holes are each filled, and the cut face of the conductive filler is exposed contiguously in the same plane between the pair of cut faces of the conductive plating layer of the end face which is obtained by cutting along the vias, and wherein the cut faces of the plurality of conductive plating layers and/or conductive filler, which are insulated from one another as a result of being partitioned by means of the groove, are used as the land patterns which are electrically connected to any of the surface-side wiring patterns and the back face-side wiring patterns, respectively, and solder-connected to the foot portion of each of the contacts of the connector for connecting printed circuit boards.

In a pad on via manufacturing process, a plurality of via holes are each filled with a conductive filler formed of a conductive paste.

Because the cut faces of the conductive plating layers and/or the conductive filler of each of the vias exposed at the end face, which is obtained by cutting along the plurality of vias, are used as land patterns which are solder-connected to the foot portion of each of the contacts, the connector for connecting printed circuit boards, in which each contact is connected to a multiplicity of wiring patterns, can be surface-mounted on the side of the printed circuit board by means of simple fabrication in which the printed circuit board is cut along each of the vias.

The cut face of the conductive filler formed of a conductive paste is contiguous in the same plane between the pair of narrow cut faces of the conductive plating layer of each via.

The electronic component mounting method according to claim 9 includes steps (A) to (G) of:

(A) forming, at least on a surface of, back face of, or inside an insulated substrate, a printed circuit board in which a plurality of conductive pattern layers are wired in parallel to the insulated substrate;

(B) providing, on the printed circuit board, a via hole which contacts the plurality of conductive pattern layers;

(C) forming a via by applying, to an inner wall face of the via hole, a conductive plating layer which is electrically connected to the plurality of conductive pattern layers which the via hole contacts;

(D) filling the via with a filler;

(E1) exposing the cut face of the conductive plating layer and the filler contiguously in the same plane at an end face obtained by cutting the printed circuit board along the via;

(E2) partitioning the cut face of the conductive plating layer and the filler by means of a groove which is provided between connecting parts which are electrically connected to the plurality of conductive pattern layers, respectively;

(F) solder-connecting a mount connecting portion of an electronic component by using the cut faces of the plurality of conductive plating layers, which are insulated from one another as a result of being partitioned by means of the groove, as land patterns, respectively, which are electrically connected to the plurality of conductive pattern layers; and (G) surface-mounting the electronic component on the end face of the printed circuit board.

A land pattern for surface-mounting an electronic component is formed on an end face along a thickness direction of the printed circuit board simply by forming a via in the printed circuit board and cutting along the via.

The electronic component mounting method according to claim 10, wherein the step (D) fills the via with a conductive filler formed of a conductive paste, and wherein the step (F) is a step which solder-connects the mount connecting portion of the electronic component by using the cut faces of the plurality of conductive plating layers and/or the conductive filler, which are insulated from one another as a result of being partitioned by means of the groove, as land patterns.

A wide land pattern for surface-mounting an electronic component is formed on an end face along a thickness direction of the printed circuit board simply by forming a pad on via in the printed circuit board and cutting along the via.

According to the invention of claim 1, a plurality of land patterns which are insulated from one another and connected to the plurality of conductive pattern layers, respectively, can be formed on an end face of the printed circuit board simply by providing a hole or a groove midway along a single via.

According to the inventions of claims 2, 4, and 10, because land patterns can be expanded to include, in addition to the pair of narrow cut faces of the conductive plating layer, the cut face of the conductive filler therebetween, the connection surface area for solder-connecting the mount connecting portions of the electronic component is enlarged, and in comparison with a case where only the pair of cut faces of the conductive plating layer is used as land patterns, a larger current can be made to flow between the land patterns and the mount connecting portions.

Further, because the cut face of the conductive filler is contiguous in the same plane between the pair of narrow cut faces of the conductive plating layer, the mount connecting portions of the electronic component which are solder-connected to the land patterns can be supported stably, and the area of the land patterns for solder-connecting the mount connecting portions is enlarged, resulting in a straightforward solder mounting process.

According to the invention of claim 3, because the printed circuit board can be connected orthogonally to a planar face which is the mounting surface of another printed circuit board, there is no interference with electronic components mounted on the mounting surface of the other printed circuit board.

Furthermore, because the signal patterns wired on the planar faces of the printed circuit board and the other printed circuit board are wired together in orthogonal directions to each other, electron interference therebetween can be reduced.

According to the invention of claim 5, the coaxial connector can be connected in the direction of extension of a microstrip line having a fixed characteristic impedance.

According to the invention of claim 6, because land patterns can be expanded to include, in addition to the pair of narrow cut faces of a first conductive plating layer or second conductive plating layer, the cut face of the first conductive filler or second conductive filler therebetween, the connection surface area for solder-connecting the first mount connecting portion of the external contact or the second mount connecting portion of the core contact of the coaxial connector is enlarged, and a larger current can be made to flow between the land patterns and the external contact or core contact.

Further, because the first mount connecting portion of the external contact and the second mount connecting portion of the core contact of the coaxial connector which are solder-connected to the land patterns can be supported stably, the area of the land patterns for solder-connecting the first mount connecting portion and second mount connecting portion is enlarged, resulting in a straightforward solder mounting process.

According to the invention of claim 7, the connector for connecting printed circuit boards which interconnects the printed circuit boards is mounted on the end face along the thickness direction of the printed circuit board, and therefore can be connected to another printed circuit board by connecting to a mating connector for connecting printed circuit boards without reducing the mounting surface area of the circuit board surface.

According to the invention of claim 8, because each of the plurality of land patterns can be expanded to include, in addition to the pair of narrow cut faces of the conductive plating layers, the cut face of the conductive filler therebetween, the connection surface area for solder-connecting the foot portion of each contact of the connector for connecting printed circuit boards is enlarged, and in comparison with a case where only the pair of cut faces of the conductive plating layer is used as land patterns, a larger current can be made to flow between the land patterns and each of the contacts.

Moreover, because the cut face of the conductive filler is contiguous in the same plane between the pair of narrow cut faces of the conductive plating layer, the foot portion of each contact of the connector for connecting printed circuit boards which is solder-connected to the land patterns can be supported stably, and the area of the land patterns for solder-connecting the foot portion of each contact is enlarged, resulting in a straightforward solder mount process.

According to the inventions of claims 9 and 10, using straightforward fabrication in cutting along the vias, electronic components can be mounted on the side along the thickness direction of the printed circuit board, and the surface area for mounting electronic components can be enlarged.

Furthermore, because electronic components are mounted in a direction orthogonal to the thickness direction of the printed circuit board, even when the mounting height on the planar face of the printed circuit board is constrained, there are no constraints on the size and mount positions of electronic components to be mounted.

Moreover, because the cut face of the filler is contiguous in the same plane between the pair of narrow cut faces of the conductive plating layer which is used as land patterns, the electronic component mount connecting portions which are solder-connected to the land patterns can be supported on the land patterns stably, resulting in a straightforward solder mounting process.

DETAILED DESCRIPTION

Figure 1:
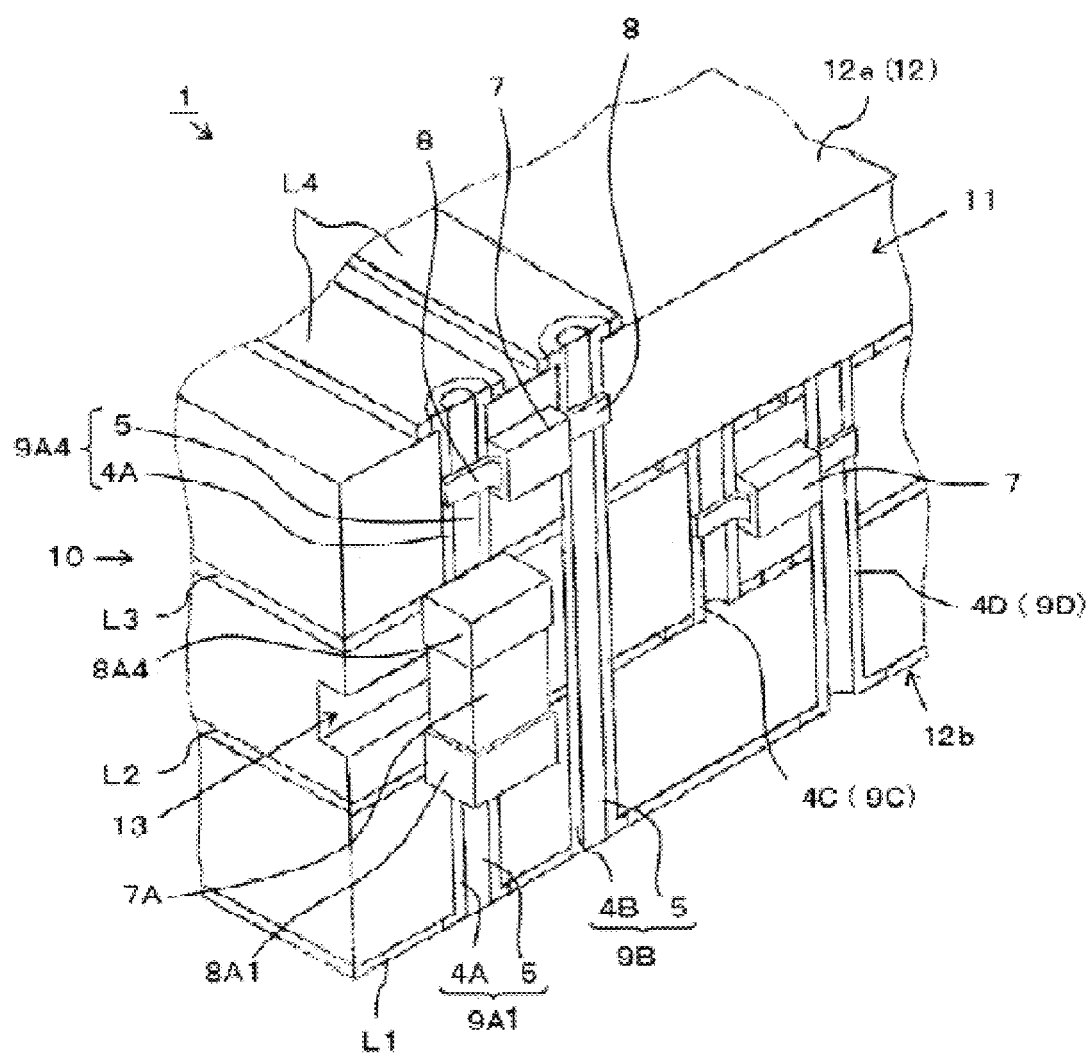
FIG. 1 is an essential part in perspective view illustrating an electronic component mounting structure according to a first embodiment of the present invention.

An electronic component mounting structure 1 and an electronic component mounting method according to a first embodiment of the present invention will be described using FIGS. 1 to 5. The printed circuit board 10 of the electronic component mounting structure 1 is a build-up substrate in which conductive pattern layers (L1 to L4) formed of four layers of copper foil or the like are wired in parallel along a surface 12a, an inner portion, and a back face 12b of an insulated substrate 12 by means of a build-up method. The mounting surface for mounting an electronic component 7 on the printed circuit board 10 is normally the surface 12a or the back face 12b. But in the present embodiment, as illustrated in FIG. 1, a plurality of surface mount electronic components 7 are mounted on an end face 11 constituting the side of the printed circuit board 10 which is parallel to the lamination direction (called the thickness direction hereinbelow) of the conductive pattern layers (L1 to L4).

Figure 2:
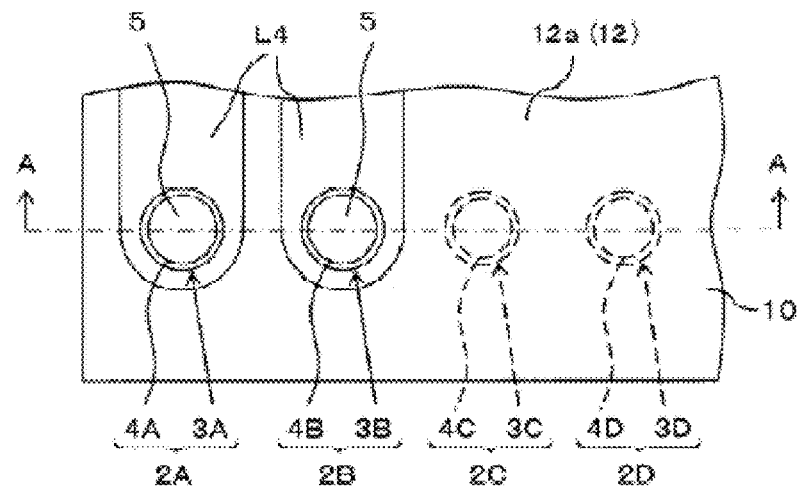
FIG. 2 is a part in enlarged planar view of a printed circuit board in which vias are formed.
Figure 3:
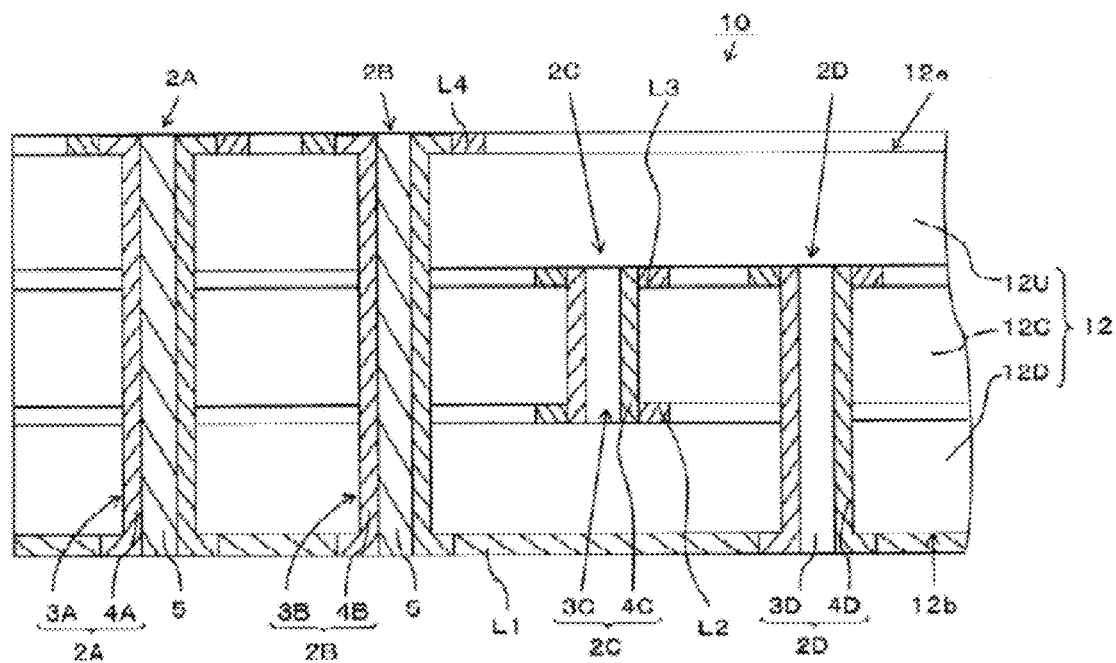
FIG. 3 is a cross-sectional view along line A-A in FIG. 2.

Four vias 2A, 2B, 2C, and 2D illustrated in FIGS. 2 and 3 are formed on the printed circuit board 10 with the objective of conducting between the conductive pattern layers (L1 to L4) in a build-up method process. Among the foregoing vias, vias 2A and 2B are through hole vias that connect conductive pattern layer L4 which is wired along surface 12a and conductive pattern layer L1 which is wired along the back face 12b. Via 2C is a buried via that connects conductive pattern layers L2 and L3 which are wired in parallel inside the insulated substrate 12. Via 2D is a blind via that connects conductive pattern layer L2 which is wired inside and conductive pattern layer L1 which is wired along the back face 12b. In the present invention, unless there is a particular need for each of the vias 2A, 2B, 2C, and 2D to be described individually, same are described as the vias 2. Furthermore, the vias 2 are formed with the objective of conducting between the plurality of conductive pattern layers (L1 to L4), but, according to the present invention, the vias 2 may be connected to only the conductive pattern layer (L1 to L4) of any one layer.

Each via 2 is provided by means of a laser or the like in the thickness direction of the printed circuit board 10 and is configured from a cylindrical via hole 3 which contacts any conductive pattern layer (L1 to L4) and a conductive plating layer 4 which is applied to the inner wall face of the via hole 3. Any metal may be used for the conductive plating but a copper plating layer 4 formed of shape-conforming copper plating is preferable. An electrical connection to the conductive pattern layers (L1 to L4) with which the via hole 3 is in contact is established as a result of the copper plating layer 4 being applied to the whole inner wall face of the via hole 3. Accordingly, a copper plating layer 4A of via 2A and a copper plating layer 4B of via 2B are electrically connected to conductive pattern layers L1 and L4, a copper plating layer 4C of via 2C is electrically connected to conductive pattern layers L2 and L3, and a copper plating layer 4D of via 2D is electrically connected to conductive pattern layers L1 and L3.

In addition, the conductive plating layer 4 applied to the inner wall face of the via hole 3 may be created by either a chemical plating method or electroplating method but, as described subsequently, electroplating is preferable since the thicker the plating thickness of the conductive plating layer 4 the better.

In the present embodiment, a via hole 3A of via 2A and a via hole 3B of via 2B are filled with a conductive filler 5 formed of a conductive paste such as silver paste by means of a method such as vacuum printing which is applied to a process for forming pad on vias for the vias 2A and 2B. However, the filler that fills via holes 3 may be an insulating filler formed of an insulating synthetic resin and, as per vias 2C and 2D, the via holes 3 need not necessarily be filled with filler.

The end face 11 of the printed circuit board 10 whereon the electronic components 7 are mounted is, as illustrated in FIG. 2, a cut face obtained by cutting the printed circuit board 10 in the thickness direction along line A-A which joins the cores of the four vias 2A, 2B, 2C, and 2D. The printed circuit board 10 may be cut by means of press working using a die, but cutting by means of routing, which enables traces to be cut accurately in the printed circuit board 10, is preferable.

Figure 4:
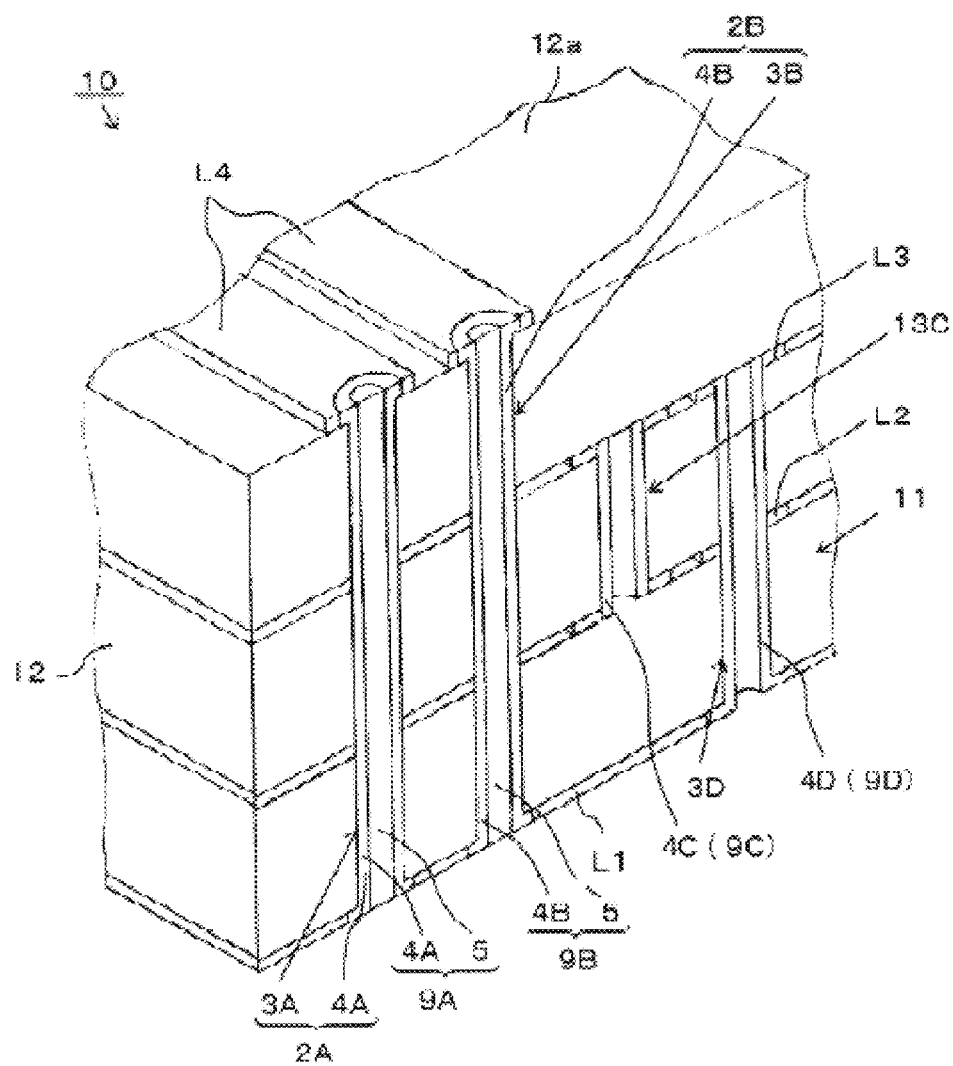
FIG. 4 is an essential part in enlarged perspective view in which the printed circuit board has been cut through line A-A along the vias.

When the printed circuit board 10 is cut along line A-A which joins the cores of vias 2A, 2B, 2C, and 2D, the cut faces of the copper plating layers 4 and conductive filler 5 of each via 2 are also visible at the end face 11 which is a cut face, as illustrated in FIG. 4. Among the foregoing cut faces, the cut faces of the copper plating layers 4 are visible via a pair of parallel, long and narrow belt-shaped contours as a result of cutting along the vias 2 because the copper plating layers 4 are applied to the inner wall face of the cylindrical via hole 3. Furthermore, when the via hole 3 of the vias 2 is filled with filler, the belt-shaped cut face of the filler, which is contiguous in the same plane with the aforementioned pair of long and narrow belt-shaped cut faces of the copper plating layer 4, is visible between the cut faces of the copper plating layer 4.

In the present embodiment, because via holes 3A and 3B of vias 2A and 2B are filled with conductive filler 5, rectangular cut faces, whose width consisting of the cut faces of the copper plating layers 4 and conductive filler 5 corresponds to the inner diameter of the via holes 3A and 3B and whose length corresponds to the thickness of a printed circuit board 10, are visible at the end face 11. Because the conductive filler 5 is electrically connected to the copper plating layers 4A and 4B respectively, the whole of the cut face of the conductive filler 5 is used for land patterns 9A and 9B which are solder-connected to mount connecting portions 8 of the electronic components 7. Furthermore, because via holes 3C and 3D of vias 2C and 2D are not filled with conductive filler 5, the cut faces of the copper plating layers 4C and 4D which are visible at the end face 11 are used for land patterns 9C and 9D which are solder-connected to the mount connecting portions 8 of the electronic components 7.

Here, the copper plating layer 4A and copper plating layer 4B are electrically connected to the conductive pattern layers L1 and L4, the copper plating layer 4C is electrically connected to the conductive pattern layers L2 and L3, and the copper plating layer 4D is electrically connected to the conductive pattern layers L1 and L3, respectively. Therefore, land patterns 9A and 9B which are electrically connected to the conductive pattern layers L1 and L4, land pattern 9C which is electrically connected to conductive pattern layers L2 and L3 and land pattern 9D which is electrically connected to conductive pattern layers L1 and L3 can be formed at the end face 11. As illustrated in FIG. 1, the electronic components 7 can be surface-mounted on the end face 11 which is parallel in the thickness direction of the printed circuit board 10.

Figure 5:
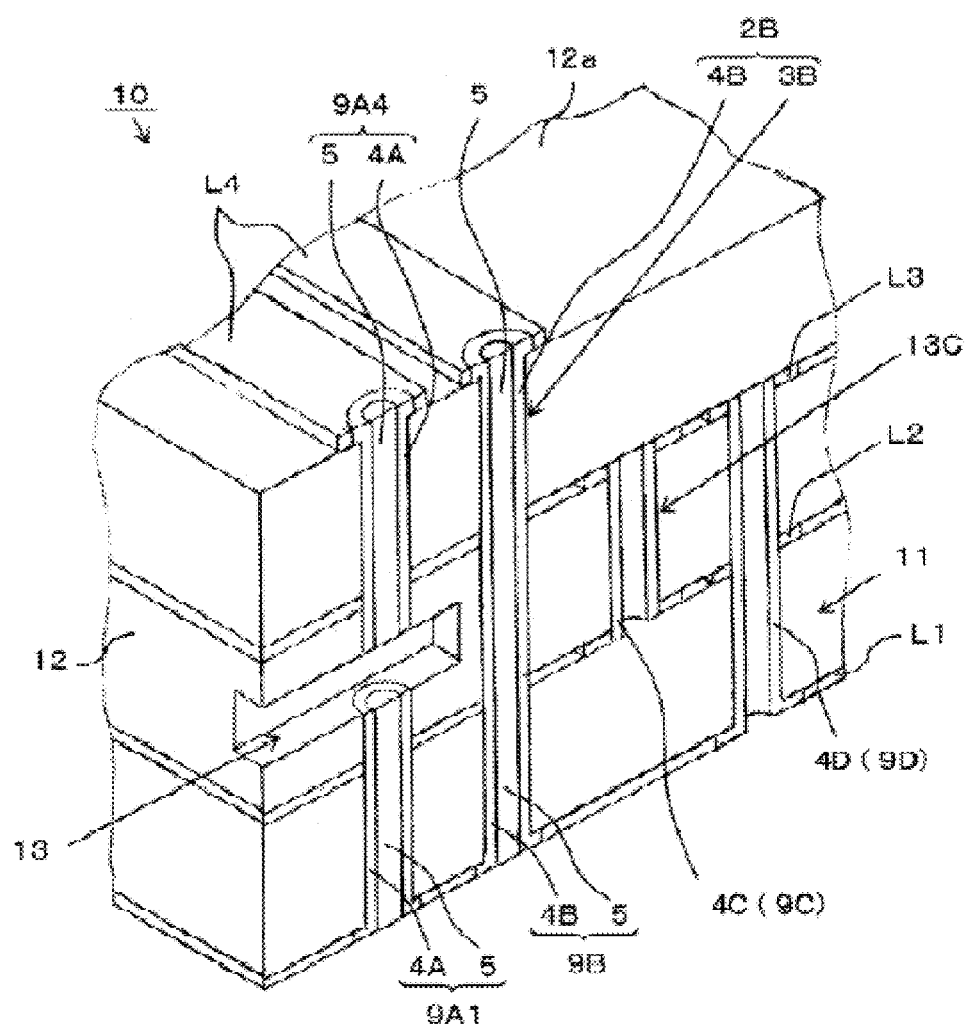
FIG. 5 is an essential part in enlarged perspective view illustrating a state where a groove has been provided in an end face of the printed circuit board cut through line A-A.

Among the foregoing, the land patterns 9 which are electrically connected to the plurality of conductive pattern layers (L1 to L4) can be partitioned into land patterns 9 which are connected to each of the conductive pattern layers (L1 to L4) by cutting the via 2 and conductive filler 5 by stamping grooves or holes between the connection positions in which the copper plating layers 4 are electrically connected to each of the conductive pattern layers (L1 to L4). For example, in the present embodiment, as illustrated in FIG. 5, the copper plating layer 4A and conductive filler 5 of via 2A which are electrically connected to the conductive pattern layers L1 and L4 are cut by means of a groove 13 which is stamped in any position between the back face 12b and surface 12a of the insulated substrate 12 which are electrically connected to the conductive pattern layers L1 and L4. Land pattern 9A which is formed for via 2A is partitioned into a land pattern 9A1 which is electrically connected to conductive pattern layer L1 and a land pattern 9A4 which is electrically connected to conductive pattern layer L4.

Accordingly, as illustrated in FIG. 1, by placing a set of conductive pads 8A1 and 8A4 of an electronic component 7A on land patterns 9A1 and 9A4, respectively, which are visible at end face 11, and solder-connecting the conductive pads 8A1 and 8A4 to the land patterns 9A1 and 9A4, the electronic component 7 interconnecting the conductive pattern layer L1 and conductive pattern layer L4 can be surface-mounted on the end face 11 of the printed circuit board 10.

A method for mounting the electronic component 7 on the end face 11 of the printed circuit board 10 thus configured will be described hereinbelow. First, the printed circuit board 10, in which four copper-foil conductive pattern layers (L1 to L4) and four vias 2A, 2B, 2C, and 2D are formed in an insulated substrate 12, is manufactured using the build-up method starting with a core layer 12C. In other words, conductive pattern layers L2 and L3 which are formed with a desired pattern are formed on the back face and surface, respectively, of the core layer 12C. A via hole 3C of a cylindrical via 2C, which passes through the conductive pattern layers L2 and L3 and the core layer 12C and contacts the conductive pattern layers L2 and L3, is provided using laser processing. Thereafter, the copper plating layer 4 is applied to the whole inner wall face of the via hole 3C, and a copper plating layer 4C which is electrically connected to the conductive pattern layers L2 and L3 is formed.

Thereafter, a lower layer 12D of an insulated substrate 12 is pasted below the core layer 12C and, using the same method, the conductive pattern layer L1, and via 2D, in which copper plating layer 4D is electrically connected to the conductive pattern layers L1 and L3, are formed. An upper layer 12U of the insulated substrate 12 is pasted above the core layer 12C and, using the same method, the conductive pattern layer L4, and vias 2A and 2B, in which respective copper plating layers 4A and 4B are electrically connected to the conductive pattern layers L1 and L4, are formed. Furthermore, in the present embodiment, because the printed circuit board 10 is cut along vias 2A, 2B, 2C, and 2D of line A-A, the vias 2A, 2B, 2C, and 2D are formed in respective positions which are on the same straight line.

Thereafter, vias 2A and 2B are filled with conductive filler 5 formed of a conductive paste and the conductive paste is cured, whereupon the printed circuit board 10 is cut using routing through line A-A illustrated in FIG. 2 along the vias 2A, 2B, 2C, and 2D, and the end face 11 of the cut face exposes the cut faces of the copper plating layers 4A, 4B, 4C, and 4D and conductive filler 5 of each of the vias 2A, 2B, 2C, and 2D, thereby forming land patterns 9A, 9B, 9C, and 9D which are solder-connected to the mount connecting portions 8 of the electronic component 7. Among the foregoing, as illustrated in FIG. 5, land pattern 9A is partitioned into land patterns 9A1 and 9A4 by providing groove 13 and, as illustrated in FIG. 5, land patterns 9A1, 9A4, 9B, 9C, and 9D are exposed at end face 11.

Thereafter, an electronic component 7 is surface-mounted on end face 11 of the printed circuit board 10 by pasting a suitable amount of solder cream using a solder dispenser onto the land patterns 9A1, 9A4, 9B, 9C, and 9D which are visible at end face 11, placing the mount connecting portions 8, which include foot portions and conductive pads of the corresponding contacts of the electronic component 7, on the land patterns 9A1, 9A4, 9B, 9C, and 9D, and heating the solder cream by means of passage through a reflow furnace or a hot air blower to solder-connect the mount connecting portions 8 of the electronic component 7 to each of the land patterns 9.

An electronic component mounting structure 20 according to a second embodiment of the present invention will be described next using FIGS. 6 to 9. Furthermore, in the descriptions of mounting structures according to further embodiments hereinbelow, configurations which work in the same or a similar way as the electronic component mounting structure 1 according to the foregoing first embodiment have been assigned the same numerals and a description thereof is omitted.

A printed circuit board 10 of a mounting structure 20 according to the second embodiment is a build-up substrate which has a conductive pattern layer L1 that covers the whole of a back face 12b of an insulated substrate 12, a conductive pattern layer L2 which is wired inside the insulated substrate 12, and a conductive pattern layer L4 which is wired along a surface 12a of the insulated substrate 12. The conductive pattern layers L1 and L2 are grounded and act as ground patterns. In addition, the conductive pattern layer L4 is one signal pattern 22 through which a high-frequency signal flows and which is wired to the surface 12a of the insulated substrate 12. Accordingly, a transmission line of a microstrip line 23 to the printed circuit board 10 is formed from ground patterns L1 and L2 and the signal pattern 22 which are wired via the insulated substrate 12 which is a dielectric.

Formed in the printed circuit board 10 is a via 2A, through which a conductive plating layer 4A is electrically connected to the conductive pattern layers L1 and L4, and a set of vias 2C and 2C through which a conductive plating layer 4C is electrically connected to the conductive pattern layers L1 and L2 on both sides of via 2A on the same straight line, and any of the vias 2A, 2C, and 2C are also filled with conductive filler 5.

Figure 8:
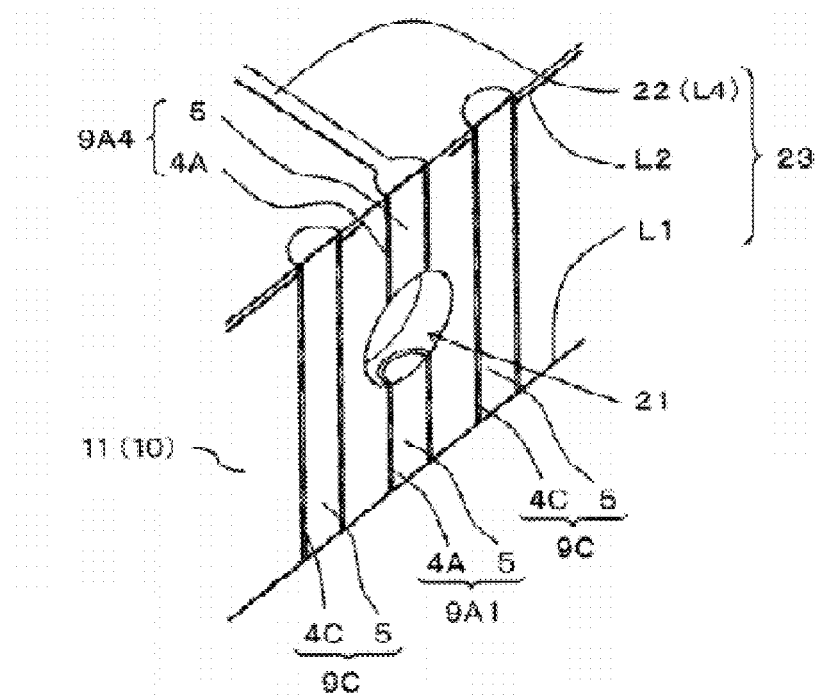
FIG. 8 is an essential part in enlarged perspective view illustrating a state where a blind hole has been provided in the end face of the printed circuit board.

Accordingly, a land pattern 9A configured from the cut faces of the conductive plating layer 4A and conductive filler 5 of via 2A and a set of land patterns 9C and 9C configured from the cut faces of the conductive plating layer 4C and conductive filler 5 of via 2C, as illustrated in FIG. 8, are visible at end face 11 which is obtained by cutting the printed circuit board 10 along the cores of the vias 2A, 2C, and 2C, and by providing a blind hole 21 midway along the land pattern 9A. The land pattern 9A is partitioned into a land pattern 9A4 which is electrically connected to upper signal pattern 22 and a land pattern 9A1 which is electrically connected to the conductive pattern layer L1 of the lower ground pattern.

The electronic component 7 mounted on end face 11 of the printed circuit board 10 is a coaxial socket 25 obtained by attaching a core contact 27 to the core of a cylindrical external contact 26 via an insulator 28. And a foot portion 27a constituting a mount connecting portion of core contact 27 is bent at a right angle so as to lie opposite and parallel to the land pattern 9A4. Furthermore, the external contact 26 has a cylindrical portion thereof for inserting foot portion 27a of core contact 27 cut away to prevent contact with core contact 27. From the remaining cylindrical end face, three foot portions 26a, 26a, and 26a constituting mount connecting portions of the external contact 26 are provided consecutively bent at a right angle to lie opposite the set of land patterns 9C and 9C and land pattern 9A1.

Figure 6:
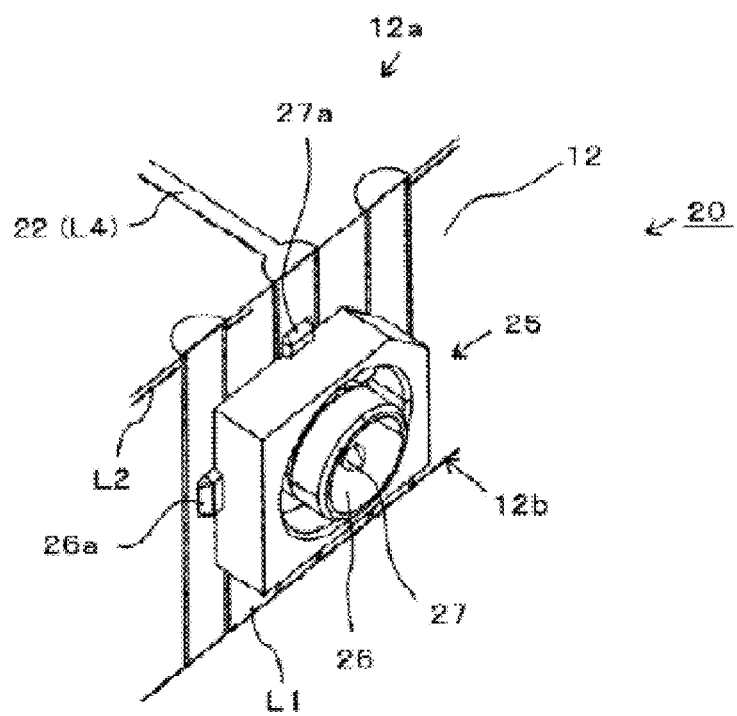
FIG. 6 is an essential part in perspective view illustrating an electronic component mounting structure according to a second embodiment of the present invention.
Figure 7:
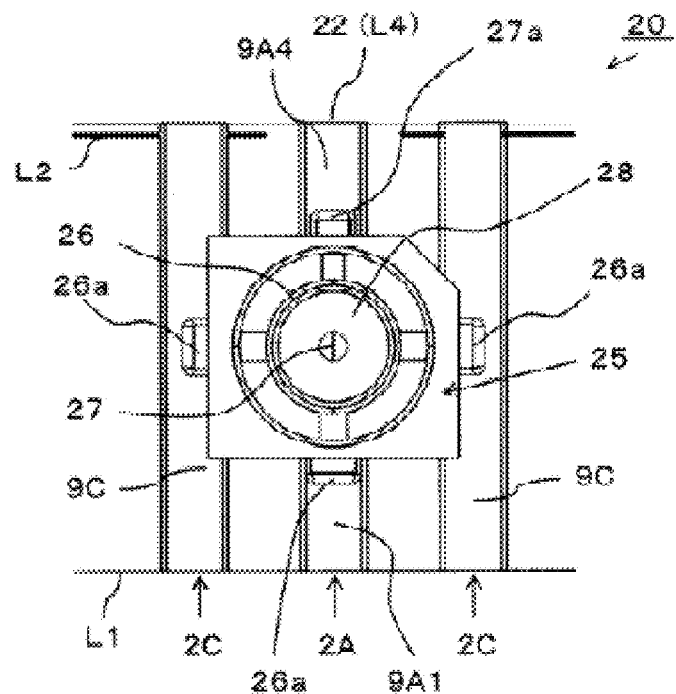
FIG. 7 is a side view illustrating a state where a coaxial socket has been mounted on the end face of the printed circuit board.

Accordingly, by soldering foot portion 27a of core contact 27 of the coaxial socket 25 to the land pattern 9A4 and soldering the end face of the external contact 26 to the set of land patterns 9C and 9C and land pattern 9A1, the core contact 27 of the coaxial socket 25 is electrically connected to the signal pattern 22, and the external contact 26 is electrically connected to the ground pattern. As illustrated in FIGS. 6 and 7, the external contact 26 is mounted on the end face 11 of the printed circuit board 10 at the end of microstrip line 23 along the direction thereof.

Figure 9:
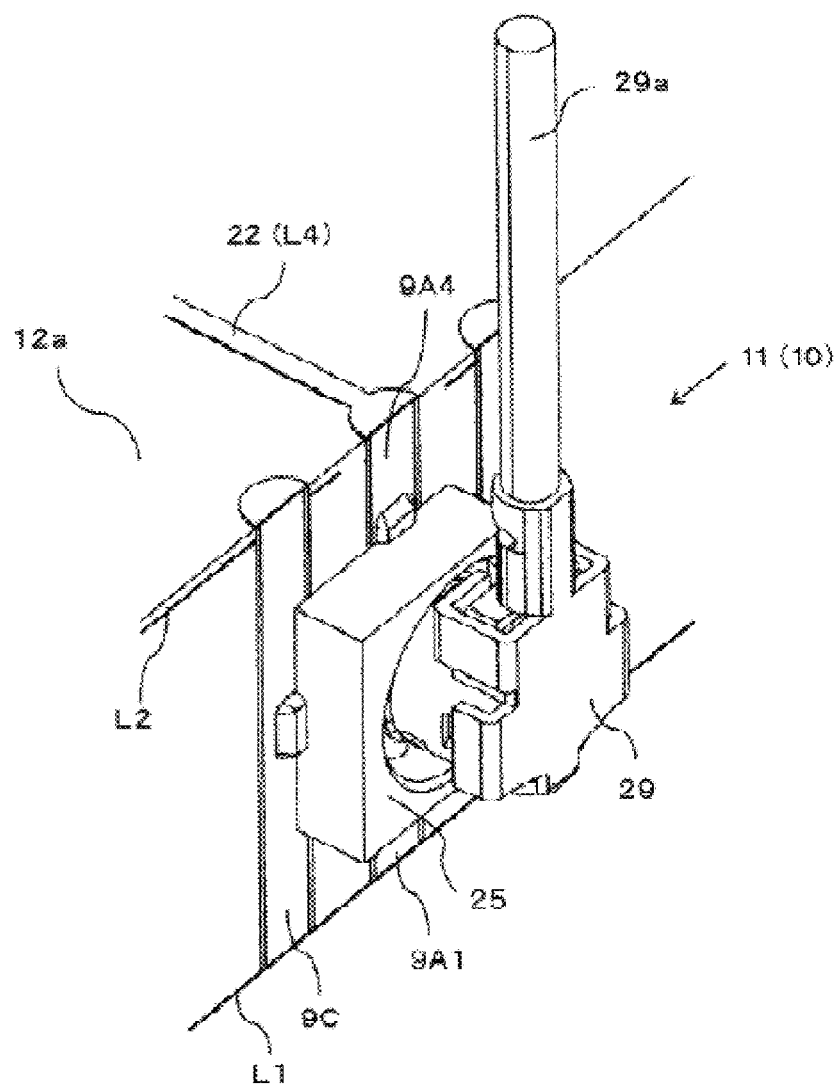
FIG. 9 is a perspective view illustrating a state where a coaxial plug has been connected to the coaxial socket.

As illustrated in FIG. 9, the connection direction of a mating coaxial plug 29 which is fitted and connected to the coaxial socket 25 is parallel to the printed circuit board 10, and hence the connection with the coaxial plug 29 does not interfere with other electronic components 7 mounted on the surface 12a or back face 12b of the printed circuit board 10. A coaxial cable 29a which is drawn from the coaxial plug 29 is not drawn along the microstrip line 23, and therefore no electromagnetic interference is generated therebetween.

In the present embodiment, the transmission line of the microstrip line 23 is formed by using the conductive pattern layer L4 formed along the surface 12a of the printed circuit board 10 as the signal pattern 22 through which a high-frequency signal flows. But by using the conductive pattern layers L1 and L4 formed along the surface 12a and back face 12b of the printed circuit board 10 as ground patterns, one signal pattern through which a high-frequency signal flows from a conductive pattern layer wired in the insulated substrate 12 may be formed, and the coaxial connectors 25 and 29 may be electrically connected from the ground patterns and signal pattern to the transmission line of the strip line.

An electronic component mounting structure 30 according to a third embodiment of the present invention will be described next using FIGS. 10 to 13. The printed circuit board 10 of the mounting structure 30 according to the third embodiment has a conductive pattern layer L1 which is wired along a back face 12b of an insulated substrate 12, and a conductive pattern layer L4 which is wired along a surface 12a of the insulated substrate 12. A conductive pattern layer L4 is configured from a multiplicity of surface-side wiring patterns 32, 32, . . . which are wired insulated from one another, and all the surface-side wiring patterns 32, 32, . . . are drawn parallel to one another to one side of the surface 12a of the printed circuit board 10 (down and to the right in FIG. 11). Furthermore, the conductive pattern layer L4 is configured from a multiplicity of back face-side wiring patterns (not shown) which are wired along the back face 12b and insulated from one another, and, on the aforementioned one side of the printed circuit board 10, the surface-side wiring patterns 32, 32, . . . are each drawn parallel to one another to positions projected onto the back face 12b.

A multiplicity of vias 2, 2, . . . , which pass through the surface-side wiring patterns 32 and back face-side wiring patterns, each of which is stacked in the thickness direction and in which the conductive plating layer 4 is electrically connected to the surface-side wiring patterns 32 and back face-side wiring patterns, are formed on the same straight line in the aforementioned one side of the printed circuit board 10 whereon the surface-side wiring patterns 32 and back face-side wiring patterns are stacked in the thickness direction, and each via 2 is filled with a conductive filler 5. However, the surface-side wiring pattern 32 and back face-side wiring patterns need not necessarily be drawn to a corresponding position in the thickness direction in a one-to-one relationship. Rather, if the via 2 passes therethrough and the conductive plating layer 4 thereof is electrically connected, the surface-side wiring patterns 32 and back face-side wiring patterns may each be drawn to any position on the aforementioned one side.

In the present embodiment, the printed circuit board 10 is cut along the multiplicity of vias 2, 2, . . . , and land patterns 9 which include the cut faces of the conductive plating layer 4 and conductive filler 5 of each via 2 are made to approach a cut end face 11. All of the land patterns 9, 9, . . . that approach like long and narrow belts along the thickness direction are partitioned into land patterns 91 which are connected to the surface-side wiring patterns 32 and land patterns 92 which are electrically connected to the back face-side wiring patterns by providing a long and narrow groove 31 in a horizontal direction midway along end face 11. In addition, alignment holes 33 and 33 which align a header connector 34, described subsequently, are provided on both sides of an inner bottom face of the long and narrow groove 31 obtained by cutting the land patterns 9.

Figure 10:
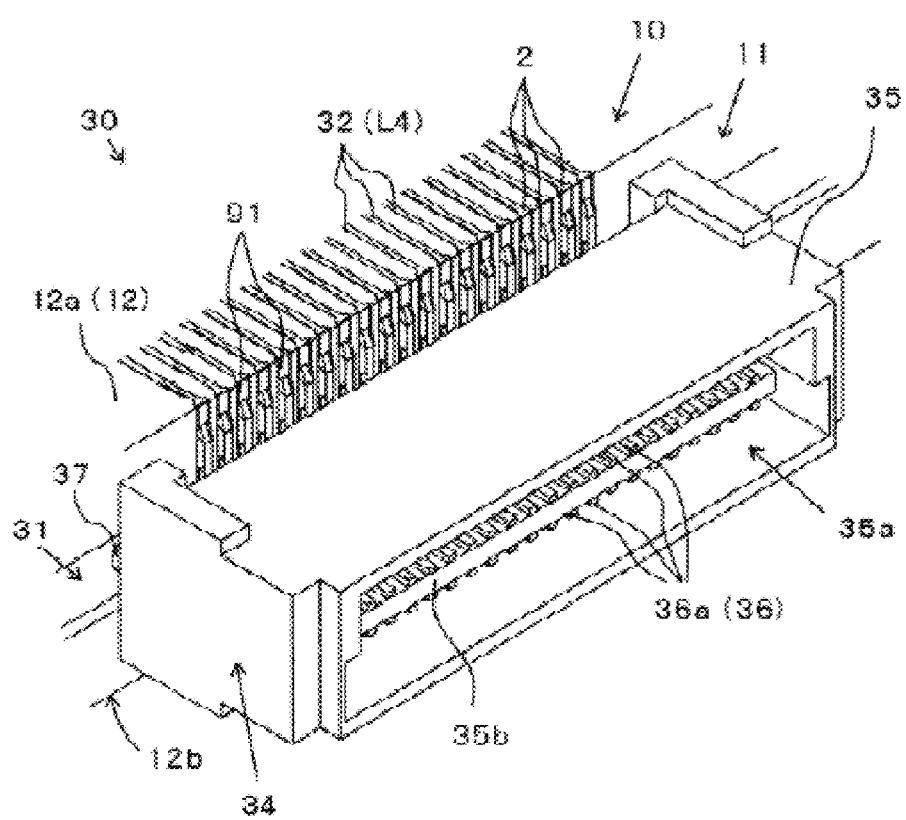
FIG. 10 is an essential part in perspective view illustrating an electronic component mounting structure according to a third embodiment of the present invention.
Figure 11:
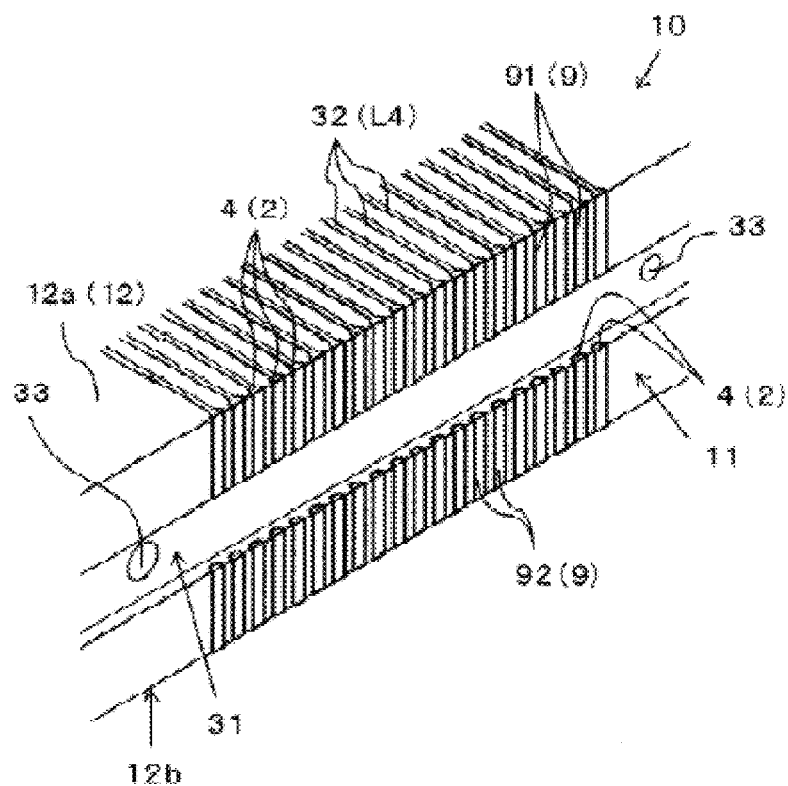
FIG. 11 is an essential part in enlarged perspective view illustrating a state where a groove has been provided in the end face of the printed circuit board.
Figure 13:
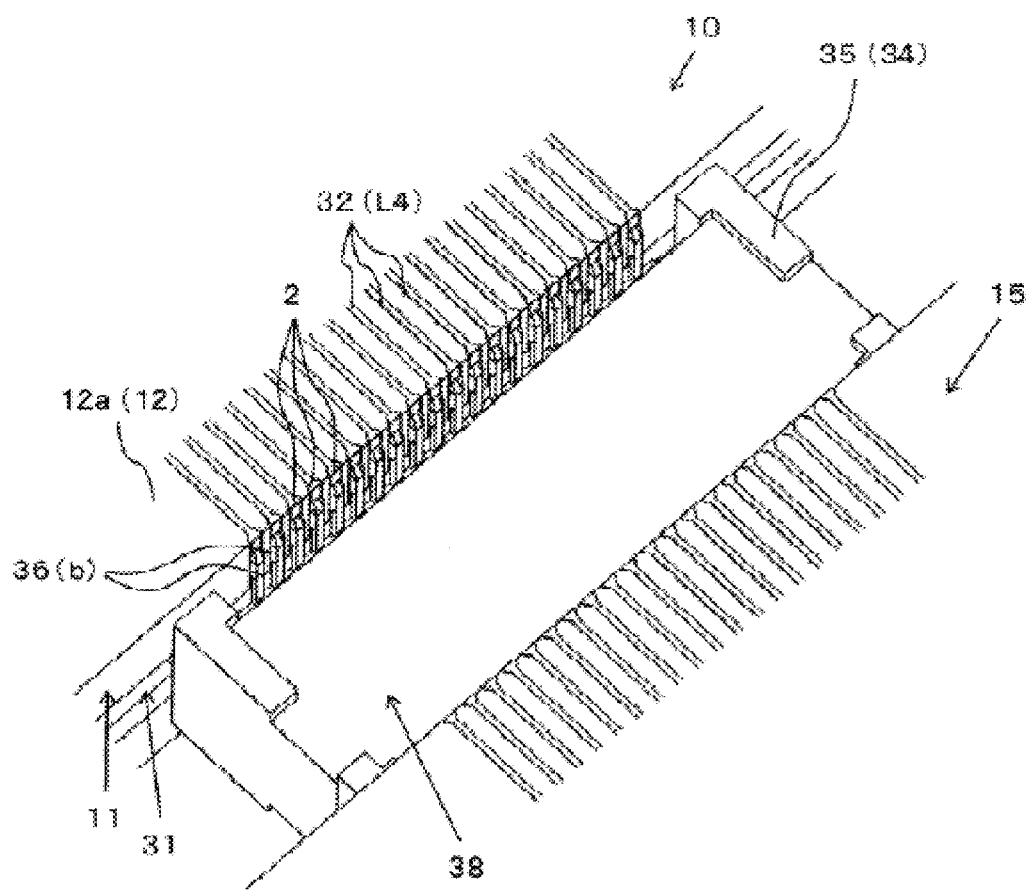
FIG. 13 is a perspective view illustrating a state where the printed circuit boards of the third embodiment are interconnected.

As illustrated in FIG. 13, the electronic component 7 to be mounted on end face 11 of the printed circuit board 10 is the header connector 34 which is fitted and connected to a socket connector 38 mounted on another printed circuit board 15 and connected between wiring patterns wired on the two printed circuit boards 10 and 15. As illustrated in FIG. 10, the header connector 34 includes a long and narrow, right-angled parallelepiped-shaped insulating housing 35 and a multiplicity of male contacts 36 which are split between two upper and lower levels and attached to the insulating housing 35 so as to be insulated from one another in a horizontal direction. A fitting recess 35a for inserting the socket connector 38 which is fitted and connected from the front (from a downward right oblique direction in the drawing) is provided in the insulating housing 35 from the front. A contact support plate 35b supporting the male contacts 36, which are split between two upper and lower levels, along the planar face and bottom face, is provided so as to protrude from the inner deep face of the fitting recess 35a. Furthermore, on both sides of a rear face opposite end face 11 of insulating housing 35, a pair of mounting bosses 37 and 37, which are inserted in alignment holes 33 and 33, respectively, and which align header connector 34 in a suitable position on the end face 11, are provided protrudingly.

Figure 12:
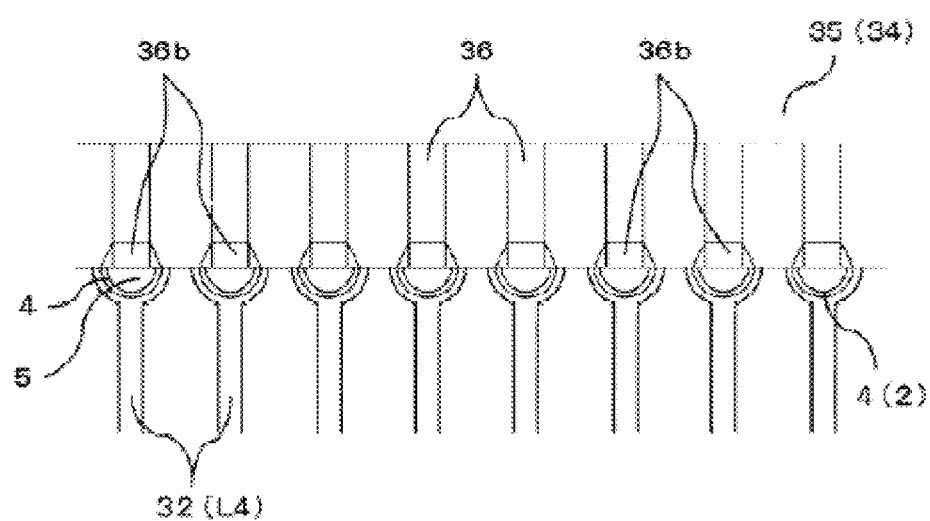
FIG. 12 is an essential part in enlarged planar view illustrating a state where a header connector has been mounted on the end face of the printed circuit board.

Upper-level male contacts 36 and lower-level male contacts 36 are each attached to the insulating housing 35 in the same quantity as the land patterns 91 and 92 so as to be exposed opposite corresponding land patterns 91 and 92 which are exposed, split between upper and lower levels, to the end face 11, the contacts 36 having a long and narrow, belt-shaped metal piece which is bent in a vertically symmetrical L shape on the upper and lower levels, a bent front section thereof constituting a contacting portion 36a which is exposed along the contact support plate 35b and a rear section thereof which is bent along end face 11 constituting a foot portion 36b. Among the foregoing, contacting portion 36a of the upper-level male contact 36 is exposed to the planar face of the contact support plate 36b and contacts a female contact (not shown) of the socket connector 38. As illustrated in FIG. 12, when the header connector 34 is aligned in a suitable position on end face 11, the rear foot portion 36b constitutes a mount connecting portion which is exposed to a corresponding position of the land pattern 91 and is solder-connected to the land pattern 91. On the other hand, the contacting portion 36a of the lower-level male contact 36 is exposed to the bottom face of the contact support plate 36b and contacts a female contact (not shown) of the socket connector 38. When the header connector 34 is aligned in a suitable position, the rear foot portion 36b constitutes a mount connecting portion which is exposed to a corresponding position of the land pattern 92 and is solder-connected to the land pattern 92.

Accordingly, after pasting solder cream onto each of the land patterns 91 and 92 exposed to the end face 11, when the mounting bosses 37 and 37 of the header connector 34 are inserted in the alignment holes 33 and 33, the header connector 34 is aligned in a suitable position, and the solder cream is heated and melted by being passed through a reflow furnace or the like, the header connector 34 is mounted on end face 11 of the printed circuit board 10 in a state where each of the male contacts 36 are electrically connected to the surface-side wiring pattern 32 and back face-side wiring pattern of the printed circuit board 10 via the land patterns 91 and 92, which are solder-connected via solder cream, and the connecting portion of foot portion 36b.

Thus, when socket connector 38, which is mounted on the end face of the other printed circuit board 15 is similarly fitted and connected, as illustrated in FIG. 13, to header connector 34, which has been mounted on end face 11 of the printed circuit board 10, the wiring patterns wired on the two printed circuit boards 10 and 15 are individually and electrically interconnected.

In each of the foregoing embodiments, a cut face obtained by cutting the printed circuit board 10 along a straight line through the core of a plurality of vias 2 is used as end face 11 which exposes land patterns 9. But as long as the cut faces are visible at end face 11, there is not necessarily any need to cut along a straight line through the cores of the vias 2. Rather, an end face 11 which cuts along a cutting line bending the plurality of vias 2 and includes a portion with a curved face is possible, and a cut face obtained by cutting along a rectangular cutting line may also be used as end face 11.

Figure 14:
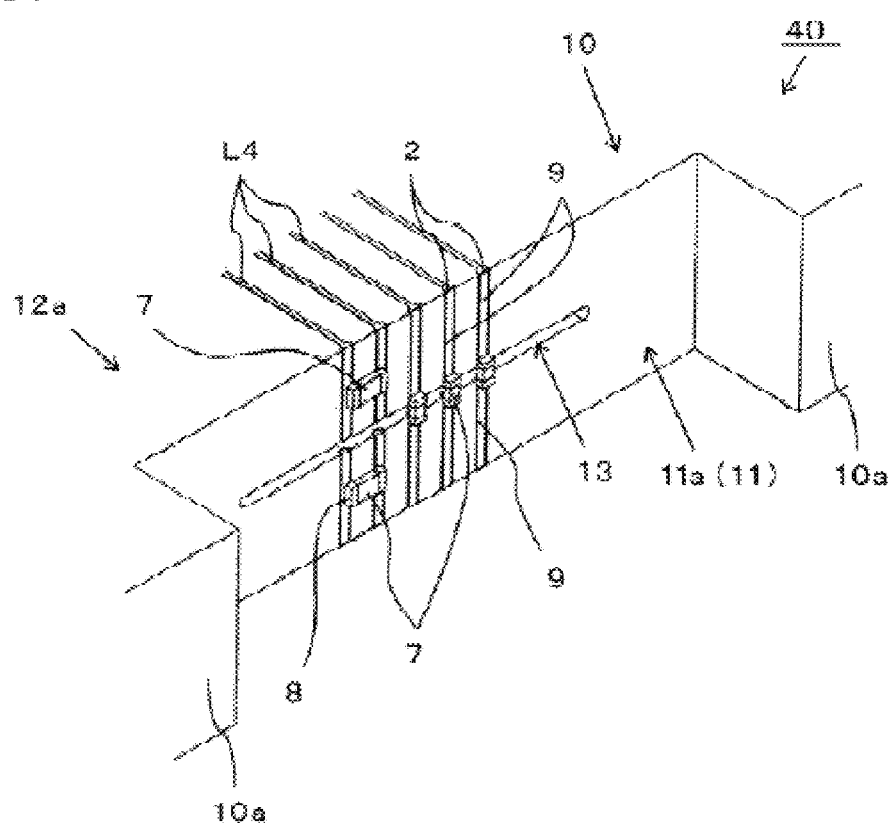
FIG. 14 is an essential part in perspective view illustrating an electronic component mounting structure according to a fourth embodiment of the present invention.

An electronic component mounting structure 40 according to a fourth embodiment of the present invention is a mounting structure obtained, as illustrated in FIG. 14, by cutting a printed circuit board 10 along a C-shaped recess that passes through a plurality of vias 2, using this cut face as an end face 11, and mounting an electronic component 7 on end face 11. In the mounting structure 40, the electronic component 7 is mounted on an inner concave face 11a of a C-shaped end face 11, and protrusions 10a of the printed circuit board 10 protrude relatively from the inner concave face 11a on both sides thereof. Therefore, the mounted electronic component 7 is protected by the protrusions 10a and is not susceptible to unintentional external forces.

Figure 15:
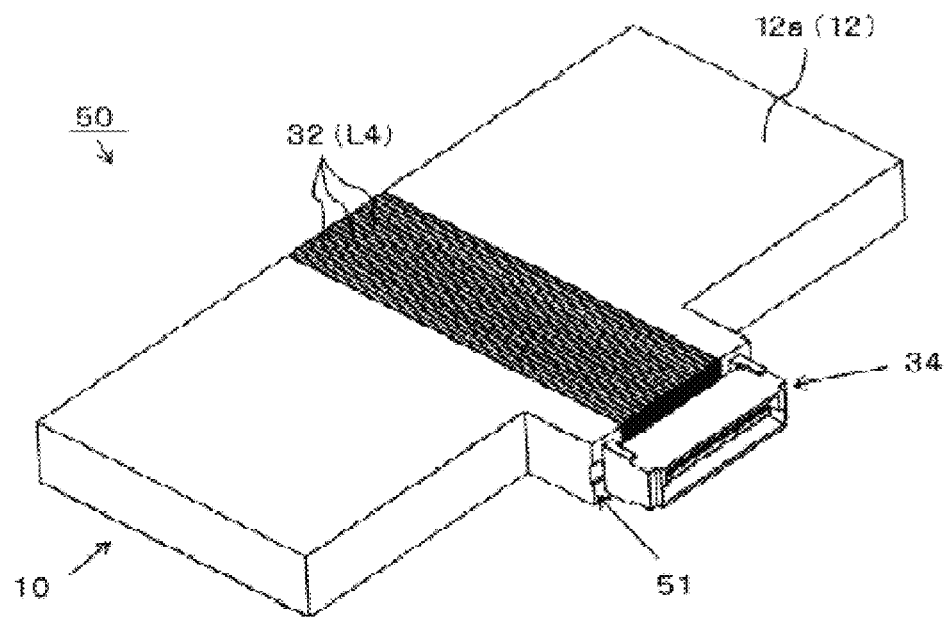
FIG. 15 is an essential part in perspective view illustrating an electronic component mounting structure according to a fifth embodiment of the present invention.
Figure 16:
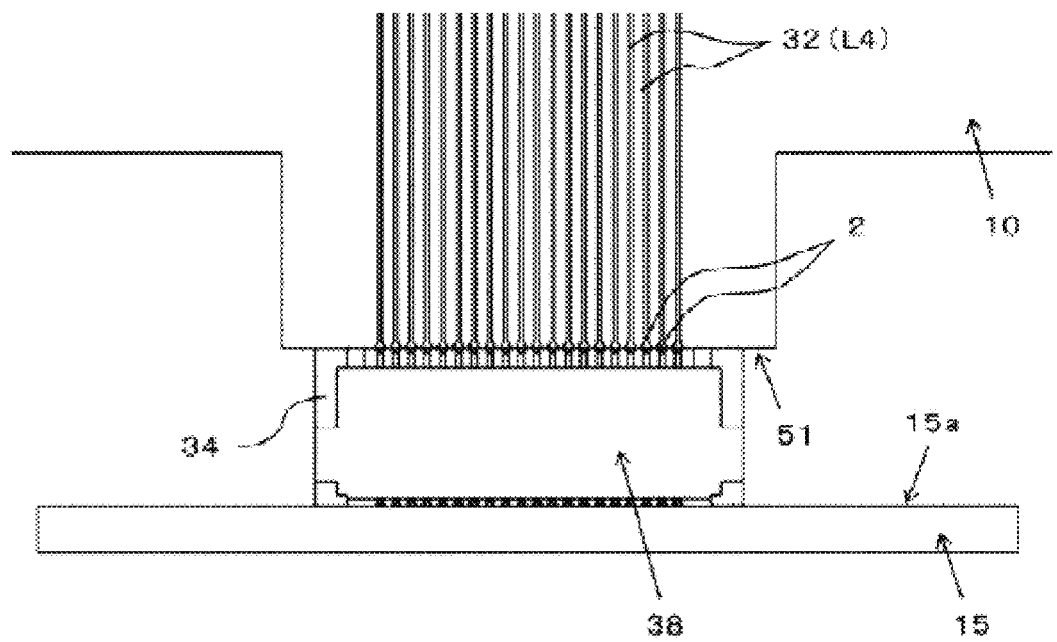
FIG. 16 is a perspective view illustrating a state where the printed circuit boards of the fifth embodiment are interconnected.
Figure 17:
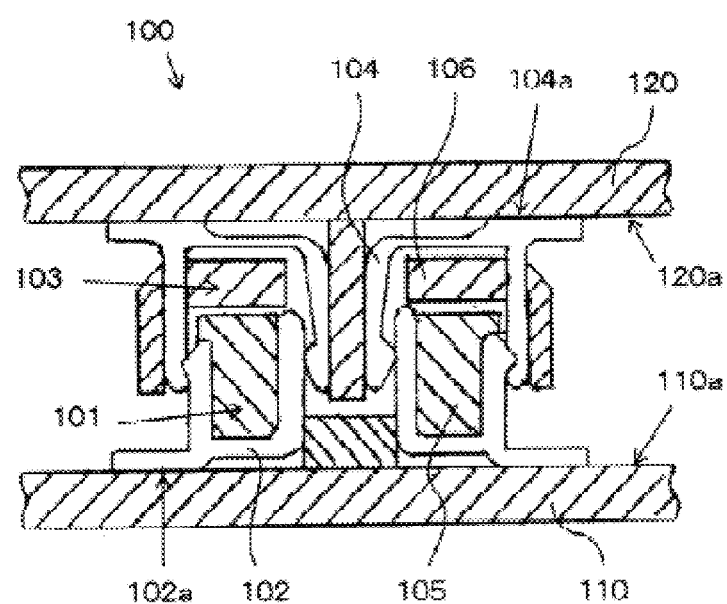
FIG. 17 is a vertical cross-sectional view illustrating a conventional electronic component mounting structure.

An electronic component mounting structure 50 according to the fourth embodiment of the present invention is a mounting structure obtained by cutting the printed circuit board 10 in the electronic component mounting structure 30 according to the third embodiment so that the cutting line for cutting the end face 11 of the printed circuit board 10 and which passes through a plurality of vias 2 constitutes one side of a tip that protrudes in a C shape from the periphery, as illustrated in FIG. 15. And using this cut face as an end face 51, and because the remaining configurations are the same as the electronic component mounting structure 30 according to the third embodiment, the same numerals are assigned to these configurations and a description thereof is omitted.

In the electronic component mounting structure 50, the end face of the protrusion 52 which protrudes in a C shape from the peripheral side of the printed circuit board 10 is used as end face 51, and the header connector 34, which is a connector for interconnecting the printed circuit boards, is mounted on end face 51. The header connector 34 is mounted on end face 51 with the direction of connection to the mating socket connector 38 which is to be fitted and connected serving as the protrusion direction of the protrusion 52. Therefore, as long as the socket connector 38 is mounted upright on a surface 15a of the other printed circuit board 15, the two mutually orthogonal printed circuit boards 10 and 15 can be interconnected.

Accordingly, the printed circuit boards can be interconnected without electronic components 7 mounted on the surface 12a or 15a of one printed circuit board 10 or 15 interfering with the other printed circuit board 15 or 10 or with the connector 38 or 34 for interconnecting printed circuit boards, which is mounted on the printed circuit board 15 or 10.

Furthermore, because the two printed circuit boards 10 and 15 are connected with an orthogonal orientation, electromagnetic interference caused by proximity between the signal patterns wired on the surface or back face of each of the circuit boards 10 and 15 can be reduced.

In this fourth embodiment, a set of printed circuit board-interconnecting connectors including a header connector 34 obtained by arranging a multiplicity of male contacts 36 and a multiplicity of female contacts in contact with the male contacts 36 which are insulated from one another, and socket connector 38 has been described; however, a case where the header connector 34 and socket connector 38 are substituted for the coaxial socket 25 and coaxial plug 29 described in the foregoing second embodiment and where coaxial lines through which high-frequency signals flow are interconnected is also applicable.

Currently, in a portable information communication terminal device such as a smartphone which is ideally as miniature as possible, the fitting and connection height of a connector for connecting printed circuit boards with a conventional structure, which connects high-frequency antenna signals between printed circuit boards, is 0.6 mm or 0.8 mm, and the maximum frequency for the antenna signals to flow has been limited to up to the 3.6 GHz band without provoking the problem of electromagnetic interference between printed circuit boards arranged in parallel and spaced apart by 0.6 mm or 0.8 mm. Accordingly, if antenna signals exceed the planned 10 GHz going forward, although electromagnetic interference between antenna signals flowing between the printed circuit boards is unavoidable, if one of the coaxial socket 25 and coaxial plug 29 is mounted on end face 11 of the printed circuit board 10 as per the present invention, two printed circuit boards 10 and 15 can be connected orthogonally, and mutual electromagnetic interference can be reduced even when antenna signals of a bandwidth of 10 GHz or more are flowing.

The printed circuit board used in each of the foregoing embodiments can be formed of a variety of materials such as a phenolic paper substrate, a glass epoxy substrate or a ceramic substrate. In addition, the foregoing printed circuit board was described as a build-up substrate, but as long as same is a printed circuit board whereon a conductive pattern is wired to any of the surface, back face, or inside of an insulator, the printed circuit board may be a single-sided board or double sided board.

In addition, in each of the foregoing embodiments, the conductive filler 5 filling the via hole 3 is filled using a portion of the steps of a pad on via process in which the opening of the via hole 3 is rendered a planar face by the filler, but the conductive filler 5 may also be filled using another method, and a pad formed by means of a pad on via process may be left on the via hole 3.

Moreover, although a variety of materials can be employed for the filler filling the via hole 3, to facilitate the process of cutting along the vias, materials that harden to a fixed hardness after the via hole 3 is filled are preferable.

The present invention is suitable for a printed circuit board for mounting a multiplicity of electronic components with a high mounting density.

What is claimed is:

1. An electronic component mounting structure, comprising:
   at least on a surface of, back face of, or inside of an insulated substrate, a printed circuit board having a plurality of conductive pattern layers disposed in parallel to the insulated substrate, a via, in which a via hole contacts the plurality of conductive pattern layers, and a conductive plating layer covering an inner wall face of the via hole and electrically connecting to the plurality of conductive pattern layers contacting the via hole, wherein cut faces of the conductive plating layer of the printed circuit board are exposed at an end face obtained by cutting along the via; and
   an electronic component having a mount connecting portion that faces the cut faces of the conductive plating layer obtained by cutting along the via,
   wherein the via is partitioned by a hole or a groove extending across the via to form connecting parts of the conductive plating layer on opposite sides of the hole or the groove, the connecting parts being insulated from one another by the hole or groove,
   wherein the electronic component is surface mounted on the end face of the printed circuit board by using the cut faces of the conductive plating layer on the opposite sides of the hole or the groove as land patterns which are solder connected to the mount connecting portion, and
   wherein one of the connecting parts on one side of the hole or the groove is connected to at least one of the plurality of conductive pattern layers, and another one of the connecting parts on the opposite side of the hole or the groove is connected to at least another one of the plurality of conductive pattern layers.

2. The electronic component mounting structure according to claim 1,
   wherein the via hole is filled with a conductive filler formed of a conductive paste,
   wherein a cut face of the conductive filler is exposed contiguously in the same plane as the cut faces of the conductive plating layer of the end face which is obtained by cutting along the via, and
   wherein the electronic component is surface-mounted on the end face of the printed circuit board by using the cut faces of the conductive plating layer on the opposite sides of the hole or the groove and the cut face of the conductive filler respectively on the opposite sides of the hole or the as the land patterns, the conductive filler respectively on the opposite sides of the hole or the groove being insulated from one another by the hole or the groove.

* * * * *